United States Patent [19]
Stengel et al.

[11] Patent Number: 5,422,597
[45] Date of Patent: Jun. 6, 1995

[54] MEANS AND METHOD OF ENHANCING SIGNAL RESOLUTION AND DYNAMIC RANGE EXTENSION IN A PULSE WIDTH MODULATION AMPLIFIER

[75] Inventors: Robert E. Stengel, Pompano Beach; David L. Muri, Sunrise; Enrique Ferrer, Miami, all of Fla.

[73] Assignee: Motorola, Inc., Schaumburg, Ill.

[21] Appl. No.: 251,227

[22] Filed: May 31, 1994

[51] Int. Cl.⁶ .............................................. H03F 3/38
[52] U.S. Cl. ................................. 330/10; 330/207 A; 330/295; 330/146
[58] Field of Search ..................... 330/10, 207 A, 251, 330/146, 124 R, 295

[56] References Cited

U.S. PATENT DOCUMENTS 4,446,440 5/1984 Bell ........................................ 330/10

*Primary Examiner*—James B. Mullins
*Attorney, Agent, or Firm*—Frank M. Scutch, III

[57] ABSTRACT

An amplifier (1) used with a pulse width modulated signal which improves the efficiency of a low level input signal comprises two or more switching devices (7,9) with common source/drain or emitter/collector connections. The gates or the bases of the devices are independently driven to optimize the efficiency of the various Rds (on) resistance values of the transistors (61, 63, 65, 89, 91, 93) used in the devices. The amplifier is operated so that during the highest output levels, select switching devices (61, 63, 65) are utilized to reduce in series resistance with the load (13). As output power decreases, devices (89, 91, 93) with higher Rds (on) resistance values are activated by a control signal which greatly improves DC to DC conversion efficiency with improved output voltage resolution, dynamic range and reduced electromagnetic interference potential.

20 Claims, 4 Drawing Sheets

MEANS AND METHOD OF ENHANCING SIGNAL RESOLUTION AND DYNAMIC RANGE EXTENSION IN A PULSE WIDTH MODULATION AMPLIFIER

TECHNICAL FIELD

This invention relates generally to a means and method of improving DC to DC conversion with improved output voltage resolution, dynamic range, reduction of electromagnetic interference potential and output efficiency of a pulse width modulated amplifier.

BACKGROUND

Pulse width modulation (PWM), sometimes referred to as pulse duration modulation, is a signal processing technique which varies pulse width to obtain an improvement in overall efficiency performance. This is accomplished by representing a sample value of an input information signal by some property of a resultant pulse other than an amplitude value. Similarly, pulse amplitude modulation (PAM) is also a sampled data type of encoding where information is encoded into the amplitude of a train of finite width pulses. When PWM is used, the samples of a message are used to vary the duration of the individual pulses while PAM is an alternative means of obtaining a lower level output signal by reducing the pulse amplitude instead of duration. Thus with PWM, information is encoded into the time parameter instead of amplitude. The modulating wave may vary the time of occurrence of the leading edge, trailing edge or both edges of the resultant pulse train.

A PWM time signal can be converted into the frequency domain by fourier analysis. The frequency representation is comprised of desired DC energy as well as undesired AC terms. Preferably, the DC component is the desired representation of the information signal sample. As the time duration of the pulse width modulated signal decreases, relative to the maximum duration, an undesired AC signal potential increases relative to the desired DC signal component. During signal amplification, this results in a decrease in the DC to DC conversion efficiency and an increase in potential electromagnetic interference (EMI) which can be experienced within an associated communications product. Additionally, EMI may be exported to nearby electronic communications equipment which may effect other systems.

In a standard pulse width modulated amplifiers using a constant pulse amplitude and frequency, the output signal is preferably related to the pulse duration. For low level output signal, the undesired EMI increases as the pulse duration decreases from its maximum. Hence, an ideal PWM amplifier will have 100% efficiency but this efficiency will be reduced by the following factors:

1. Switching device resistance in series with the load impedance e.g. Rds (on) values;
2. AC currents dissipated in the parasitic and desired real components in the load loop;
3. Switching transit time resulting in node voltages across the switching devices during current flow; and
4. The charging of large capacitances of each node associated with the switching devices.

A variety of techniques have been used in helping to offset these factors. These include minimizing the AC power dissipation at the amplifier output using an inductor placed in series with the load. This acts to increase the impedance to any AC signals at the sampling frequencies and their related harmonics. Additionally, increasing the sampling frequency works to reduce the AC dissipation, however, the associated transit and capacitance charging dissipation of the amplifier will also increase. At maximum power output, the minimum Rds(on) value maximizes efficiency. Since the capacitance charging is a fixed dissipation constant, this most often presents a set of tradeoffs which must be factored in to achieve optimized efficiency.

DETAILED DESCRIPTION OF THE PREFERRED EMBODIMENT

Figure 1:
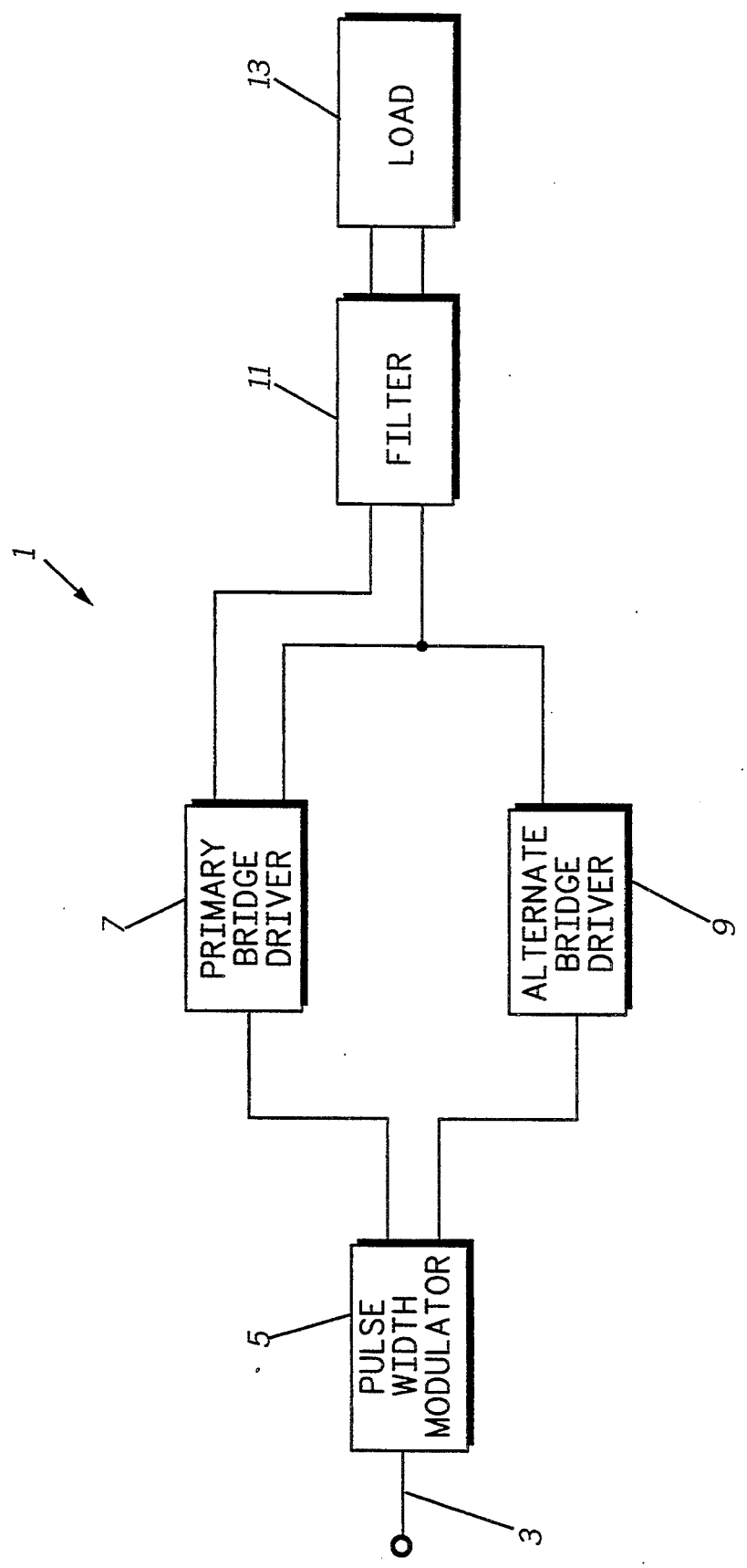
FIG. 1 is a block diagram showing the configuration of the present invention.

Referring now to FIG. 1, a block diagram of the invention is shown generally at 1, where an input signal 3 is input to a pulse width modulator 5. The output of the pulse width modulator 5 is directed to both a primary bridge driver 7 and an alternative bridge driver 9 which are connected in parallel. The outputs the primary bridge driver 7 and alternative bridge 5 driver 9 are directed to a filter 11 whose output drives load 13.

Figure 2:
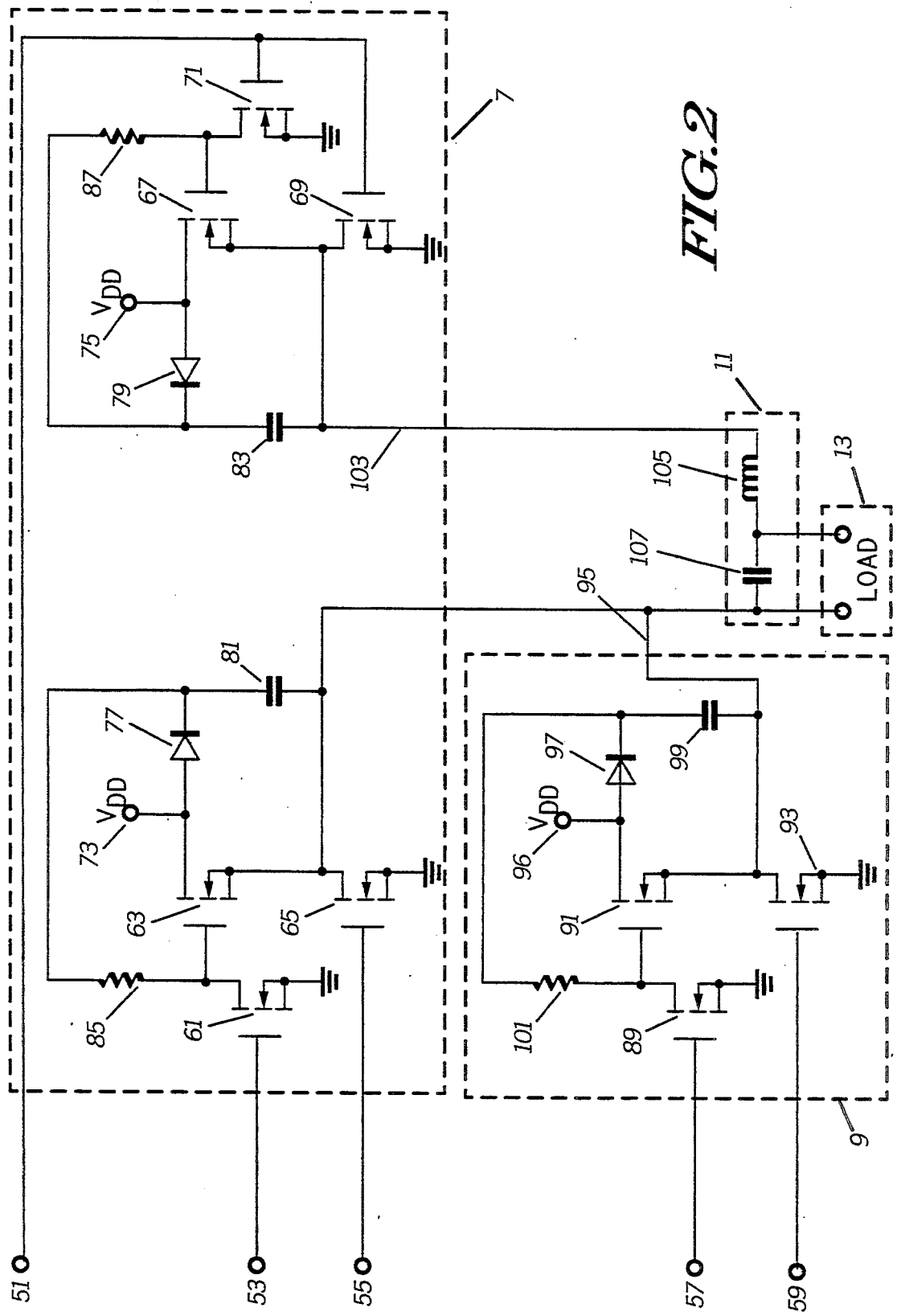
FIG. 2 is a schematic diagram showing a combination of dual half bridge drivers in accordance with the objects of the present invention.

FIG. 2 is a schematic representation of one embodiment of the present invention showing a class AD switching amplifier with at least two sets of switching devices represented by the primary bridge driver 7 and the secondary bridge driver 9. More specifically, an input signal (not shown) drives a pulse width modulator (not shown) as in FIG. 1. A first half of the output of the pulse width modulator is applied to input line 51 which is one half of the primary bridge driver 7. The second half of the pulse width modulator is applied to both input lines 53/55 and 57/59. Input lines 53/55 are the second half of the primary bridge driver 7 while input line 57/59 feed the alternate bridge driver 9. Primary bridge driver 7 is comprised of a first set of N-channel MOSFET devices which are used to switch and amplify the pulse width modulated signal. Devices 63 and 65 are substantially large semiconductor devices which have a low Rds (on) resistance value. This value is the resistance as measured between the drain and the source of the device while in an "on" state. A lower Rds (on) resistance generally allows for a higher output power. An example of this type of device would be Motorola discrete devices MTA3055E or MTA2955 which provides an Rds (on) resistance of 0.1 ohms and 0.3 ohms. These devices are preferably N-channel MOSFET semiconductor transistors which are preferred over the P-channel variety due to their higher mobility and small size for the same Rds (on) value.

Further, a logic signal is applied to logic input 55 which allows transistors 63 and 65 to be alternately switched on or off depending on the state of the logic signal. For example, a low logic state applied to logic input 53 and a low logic state applied to the logic input 55 would allow transistor 63 to be in an "on" condition while keeping transistor 65 in an "off" or non-operational state. By applying a high logic signal to logic input 53 and a high logic signal to logic input 55, transistor 65 would turn "on" while turning "off" transistor 63. Thus, transistors 63 and 65 are capable of tristate operation, with transistor 63 on/transistor 65 off, transistor 63 off/transistor 65 on, or when both transistor 63 and 65 are both off. The state of these devices will depend on the state of the input signal applied to input line 53 and the state of the logic signal applied to logic input 55. This is illustrated in Table I which shows a logic table with various logic states applied to logic input 53 and logic input 55. The resultant signal is shown at output 66.

TABLE I

| Input line 53 | Input line 55 | Output line 66 |
| --- | --- | --- |
| low | low | high |
| high | low | high Z |
| high | high | low |
| low | high | FORBIDDEN |

Further, a supply voltage 73 and 75 is applied to the drain of transistors 63 and 67 while diodes 77, 79, capacitors 81, 83 and resistors 85, 87 insure proper current flow from the drain to the gate of the N-channel devices used in the supply side of the bridge.

As mentioned previously, there are instances where it is necessary to increase the dynamic range of the pulse width modulated signal due to the decreasing width of the amplified pulse. The small pulse width represents the lower limit of the signal. This increase in dynamic range is accomplished using alternate bridge driver 9. Alternate bridge driver 9 is comprised of transistors 89, 91 and 93. These transistors are smaller in size than those used in primary bridge driver 7, have a higher Rds (on) resistance value. In operation, the higher Rds resistance value of transistors 91, 93 provides a pulse amplitude reduction of the pulse modulated input signal applied to the output line 95. As with the primary bridge driver 7, a logic signal is used with logic input 59 to turn transistor 93 on or off. A tie line 95 attaches the halves of the primary bridge driver 7 and alternative bridge driver 9 in parallel. Both logic signals applied to logic input lines 55 and 59 are used to actuate either of the bridge drivers depending on signal requirements. Thus, the logic signal determines whether either transistors 63 or 65 are used in the primary bridge network or whether transistors 91 or 93 are used in the alternate bridge network. Transistors 63, 65 and transistors 91, 93 can only be operated together with different pulse duration during a specific switching cycle, and work to provide an increased output voltage resolution determined by the level of pulse used as an output signal. Further, as in the primary bridge driver 7, a supply voltage 96 is applied to transistor 91. Diode 97, capacitor 99 and resistor 101 insure correct current flow between the drain and gate of transistor 91. A low pass filter circuit 11 attaches between the output lines 95, 103 and the load 13. Load 13 is typically an audio speaker (not shown). The filter circuit 11 is comprised of an inductor 105 and capacitor 107 which are serially connected and attached in parallel across the output lines 95, 103. The filter acts to remove unwanted AC components from the amplified PWM signal. The low pass response created by the filter 11 allows only DC components to be delivered to the speaker by increasing the impedance to any AC signal component. Typically, the filter 13 is set to remove frequencies above the actual signal delivered to the speaker which is approximately 5 KHz.

Figure 3:
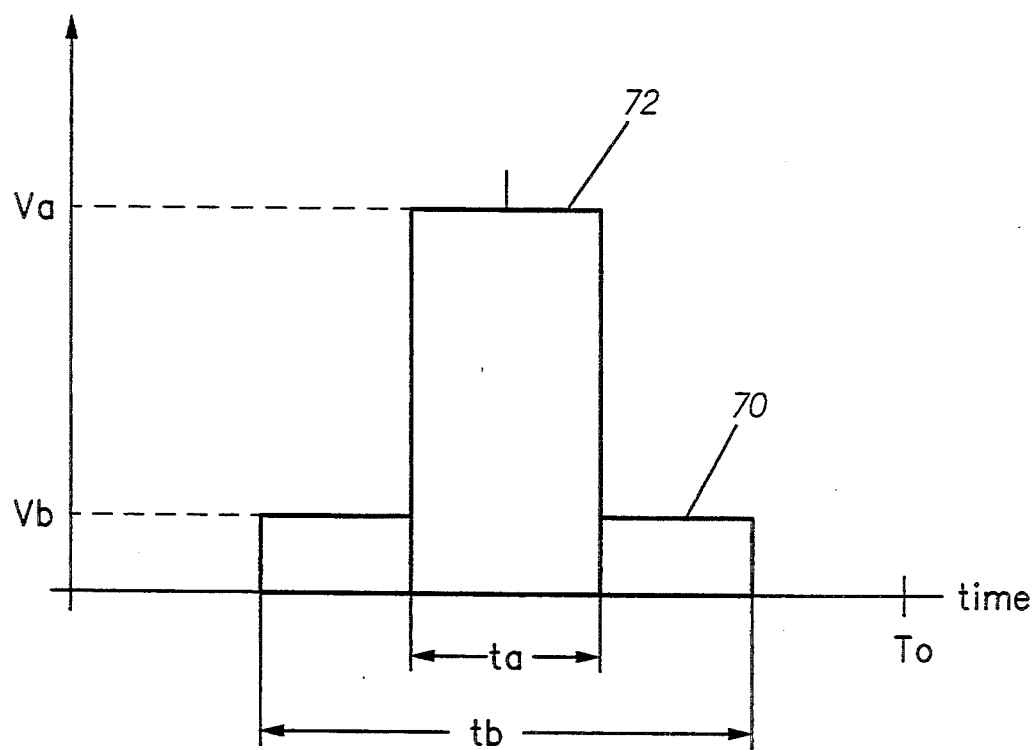
FIG. 3 is a diagram showing the dual switching amplifier out voltage relations with load voltage as a function for the switching device Rds (on) resistance.

FIG. 3 is a representation of the voltage across terminals 95 and 103 function of the switching device Rds(on) resistance value which is chosen. In the graph, the Y axis represents the magnitude of the voltage applied to the terminals while the X axis represents time. Therefore, during one switching cycle t0, different combinations of transistors are used throughout the primary bridge network 7 and alternate bridge network 9. For example, during the lower input voltage signal level represented by 70, either set of transistors 69 and 91 are on or transistors 67 and 93 are on. Thus, the alternative bridge network 9 is always used when the input voltage is low. During a high input voltage signal level represented by 72, either combination of transistors 63/91 and 69 are on or transistors 65/93 and 67 are on. The devices 63 and 65 provide a low Rds (on) resistance value in view of the high signal voltage amplitude. Using the representation in FIG. 4, the voltage presented across terminals 95 and 103 can be represented by the following equation:

$$V_x = \frac{(VDD)\,(R_{ds(on)})x}{R_{ds(on)x} + Z_{load}}$$

where VDD=Supply voltage;

$R_{ds(on)}x$=Total device resistance in output loop;

$Z_{load}$=Impedance across the output terminals 95 and 103; and

Sample voltage = $(V_s)$ =

$$V_a\left(\frac{t_a}{T_0}\right) + V_b\left(\frac{t_b}{T_0}\right) - V_b\left(\frac{t_a}{T_0}\right)$$

Figure 4:
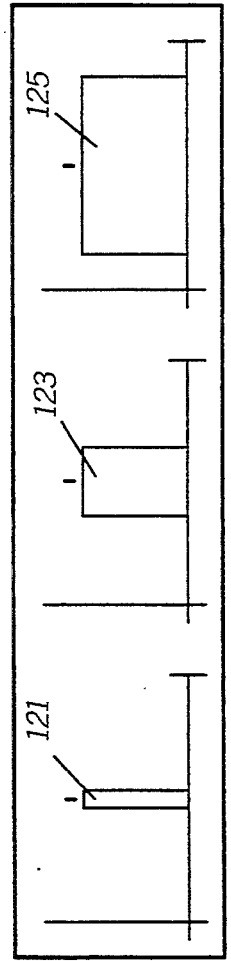
FIGS. 4, 5 and 6 are matrix diagrams showing the output pulse variations of the dual half bridge circuit shown in FIG. 2.
Figure 6:
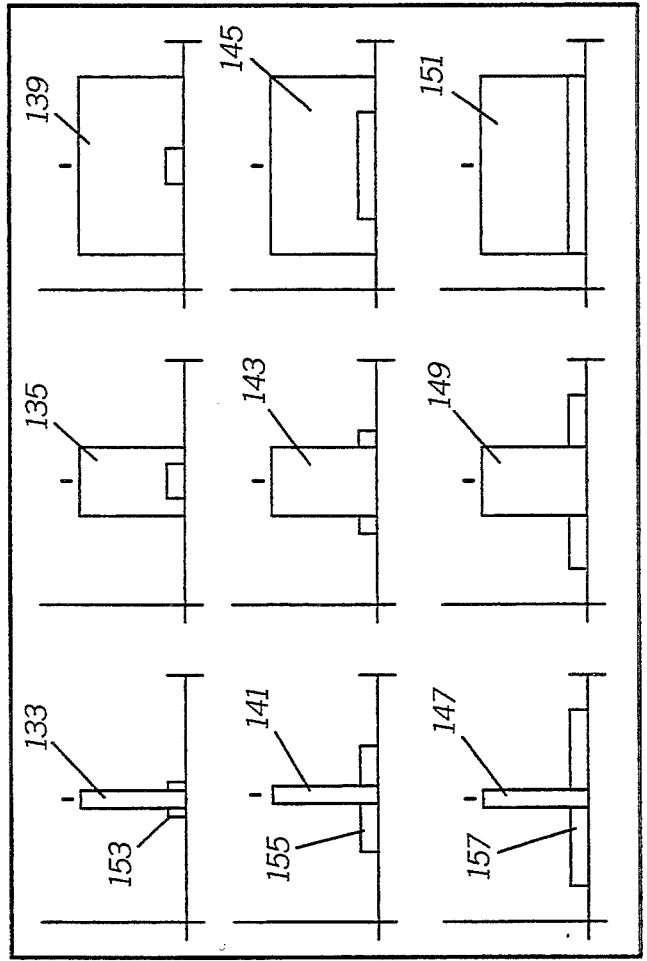
Figure 5:
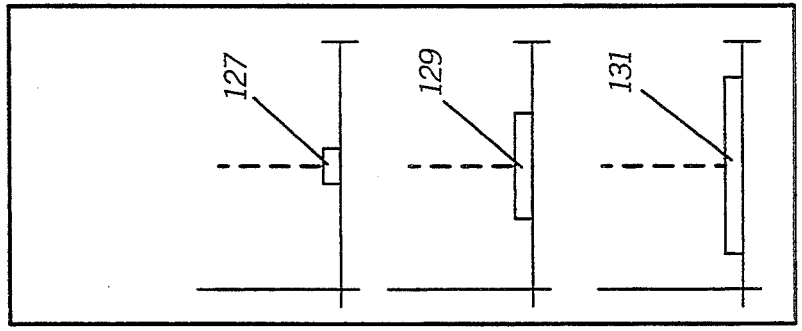

FIGS. 4, 5 and 6 are matrix diagrams showing the different configurations in which the switching transistors can be used in both the primary bridge driver 7 and the alternate bridge driver 9. In FIG. 4, each graph illustrates primary bridge driver 7 used only. Thus, transistors 63 and 65 are being alternately switched on for a greater duration. Transistors 67 or 69 are always in an alternating on state. As can be readily seen, the amplitude of the pulses 121, 123 and 125 remains constant at a high level while the width of the pulses increase in duration with time.

As seen in FIG. 5, when a low level input signal is used, alternate bridge driver 9 is used and transistors 91 or 93 and transistors 69 or 67 are the only devices which are used. Moving from the upper section of the figure to the lower section, each graphical representation shows a low amplitude while the width of pulses 127,129 and 131 expand as transistors 91 and 93 are alternately switched on for greater periods of time.

Finally in FIG. 6, various combinations of transistors 63, 65, 91 and 93 are used. The graphs moving left to right on the matrix illustrate transistors 63 and 65 switched on for a greater periods of time. This can be seen from the constant amplitude and expanding width of the pulses 133 through 151. Moving from the upper graphs to the lower graphs, transistors 91 and 93 are switched on for a greater periods of time. In each configuration, transistors 67 or 69 are always in an alternating on state. This is best seen, for example, in the low amplitude and expanding pulse width of pulses 153 through 157. The use of both the primary bridge driver 7 and the alternate driver 9 during a sampling period provides an increased resolution in the voltage applied to the output terminals 95 and 100 in FIG. 2.

After viewing the resultant pulses illustrated in the above graphs, one skilled in the art can realize the advantages of utilizing two bridge drivers whose devices include different Rds(on) parameters. The pulse width and/or amplitude of the output pulse can be varied depending on input signal parameters. This is easily accomplished using various switching configurations and periods of actuation of the amplifier devices. The overall benefit in using this technique, allows the output pulse width modulated signal to be easily varied at the load helping the overall dynamic range, signal quality and efficiency of the amplifier circuit.

In summary, the invention may be described as a means and method of improving the dynamic range, resolution and efficiency of a PWM amplifier. The invention utilizes a combination of two or more half bridge drivers with predetermined drain source resistances to achieve an optimal combination of PWM and PAM. Utilizing multiple drivers depending on signal conditions optimizes the output efficiency and reduces EMI of the amplifier. Specifically, the efficiency of the amplifier output power level is increased by using two or more solid state switching devices with common source/drain or emitter/collector connections. The gates of the bases of these devices are independently driven with an input signal to optimize the efficiency tradeoff of a minimum Rds(on) resistance and a minimum Ciss/Coss input/output capacitance for each sampling period. At the highest power output levels, each of the switching devices are utilized to reduce resistance in series with the load. As the output power requirement decreases, the number of devices applied also decreases to reduce the power dissipated in the capacitance charging process. This ultimately increases the output efficiency, dynamic range, resolution, and reduces EMI of the PWM amplifier.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An amplifier system used for amplifying a pulse width modulated signal input from a pulse width modulator, said pulse width modulated signal having either a low level or a high level, said amplifier system comprising:
    a first bridge driver for controlling the pulse width and amplitude of said pulse width modulated signal in a first predetermined range;
    a second bridge driver for controlling the pulse width and amplitude of said pulse width modulated signal in a second predetermined range; and
    whereby said first bridge driver and said second bridge driver are operated alternately depending on the pulse width and amplitude of said pulse width modulated signal to provide an increased output voltage resolution of said pulse width modulated signal.

2. The amplifier system according to claim 1 further comprising:
    a means for filtering connected to an output of said first bridge driver and said second bridge driver for filtering a predetermined range of frequency components.

3. The amplifier system according to claim 2 wherein said means for filtering is a low pass filter.

4. The amplifier system according to claim 2 further comprising:
    a load for terminating the output of said means for filtering.

5. The amplifier system according to claim 1 wherein said first predetermined range defines when said pulse width modulated signal is at said low level.

6. The amplifier system according to claim 1 wherein said second predetermined range defines when said pulse width modulated signal is at said high level.

7. The amplifier system according to claim 1 wherein said first bridge driver controls the pulse width and amplitude of said pulse width modulated signal during a period said pulse width modulated signal is at said low level.

8. The amplifier system according to claim 1 wherein said second bridge drier controls the pulse width and amplitude of said pulse width modulated signal during a period said pulse width modulated signal is at said high level.

9. The amplifier system according to claim 1 wherein said first bridge driver and said second bridge driver are switched from an off state to an on state using a least one control signal.

10. The amplifier system according to claim 1 wherein said first bridge driver and said second bridge driver are comprised of a plurality of switching devices.

11. The amplifier system according to claim 10 wherein said plurality of switching devices are N-channel MOSFET's.

12. A pulse width modulated amplifier having at least one input for receiving pulse width modulated signals, said pulse width modulated signals having a plurality of states, said plurality of states having either a high level or a low level, said amplifier comprising:
    a first driver which is controlled by at least one first control signal for switching and amplifying said pulse width modulated signal when said pulse width modulated signal is at said low level;
    a second driver which is controlled by at least one second control signal for switching and amplifying said pulse width modulated signal when said pulse width modulated signal is at said high level;
    a filter attached to an output of both said first driver and said second driver for removing undesired AC signal components from an amplified signal produced by said first driver and said second driver; and
    wherein said first driver and said second driver are selectively actuated using said at least one first control signal and said at least one second control signal to enhance the signal resolution of said pulse width modulated signal.

13. A pulse width modulated amplifier as in claim 12 further comprising a speaker connected to said filter for providing an audio output.

14. A pulse width modulated amplifier as in claim 12 wherein said first driver and said second driver include a plurality of switching transistor which are controlled using said at least one first control signal and said at least one second control signal for selecting the duration upon which said first and second driver means are used to amplify said pulse width modulated signal.

15. A pulse width modulated amplifier as in claim 12 wherein said plurality of switching transistors used in said first driver are N-channel MOSFET's having a substantially low Rds (on) resistance.

16. A pulse width modulated amplifier as in claim 12 wherein said plurality of switching transistors used in said second driver are N-channel MOSFET's having a substantially high Rds (on) resistance.

17. A method of increasing the dynamic range of a pulse width modulated amplifier comprising the steps of:
providing a pulse width modulated input signal;
directing said pulse width modulated signal to at least two bridge drivers connected in parallel; and
switching said pulse width modulated signal between said two bridge drivers depending on the amplitude of said pulse width modulated input signal to improve DC to DC conversion efficiency of said pulse width modulated amplifier for improving output voltage resolution and dynamic range of said pulse width modulated signal.

18. A method of increasing the dynamic range of a pulse width modulated amplifier as in claim 17 further comprising the step of including at least one transistor in said at least two bridge drivers with a substantially high Rds (on) resistance.

19. A method of increasing the dynamic range of a pulse width modulated amplifier as in claim 17 further comprising the step of including at least one transistor in said at least two bridge drivers with a substantially low Rds (on) resistance.

20. A method of increasing the dynamic range of a pulse width modulated amplifier as in claim 17 wherein said switching step includes the steps of selecting a first bridge driver of said at least two bridge drivers during periods when said amplitude is at or above a predetermined level and selecting a second bridge driver of said at least two bridge drivers during periods said amplitude falls below said predetermined level.

* * * * *